(12) United States Patent
Frankowsky et al.

(10) Patent No.: US 7,061,260 B2
(45) Date of Patent: Jun. 13, 2006

(54) CALIBRATION DEVICE FOR THE CALIBRATION OF A TESTER CHANNEL OF A TESTER DEVICE AND A TEST SYSTEM

(75) Inventors: Gerd Frankowsky, Höhenkirchen (DE); Thorsten Bucksch, München (DE); Gerd Brösamlen, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/894,942

(22) Filed: Jul. 20, 2004

(65) Prior Publication Data
US 2005/0046436 A1 Mar. 3, 2005

(30) Foreign Application Priority Data
Jul. 21, 2003 (DE) ................................ 103 33 101

(51) Int. Cl.
*G01R 31/02* (2006.01)

(52) U.S. Cl. .................... 324/756; 324/754; 324/158.1

(58) Field of Classification Search ..................... None
See application file for complete search history.

(56) References Cited

U.S. PATENT DOCUMENTS 6,856,154 B1* 2/2005 Song et al. .................. 324/754
6,911,814 B1* 6/2005 Miller et al. .............. 324/158.1

FOREIGN PATENT DOCUMENTS

DE  100 56 882 A1  6/2002

OTHER PUBLICATIONS

Greman Examination Report dated Feb. 5, 2004.

* cited by examiner

*Primary Examiner*—Minh N. Tang
(74) *Attorney, Agent, or Firm*—Patterson & Sheridan, L.L.P.

(57) ABSTRACT

A calibration device for the calibration of a tester channel of a tester device is provided. The calibration device includes a connecting device and a planar contact carrier with a first contact area and a second contact area insulated from the first contact area, the first contact area being generally surrounded by the second contact area, so that, when a needle card connected to the tester device is placed onto the contact carrier of the calibration device, one of the contact-connecting needles of the needle card which is connected to the tester channel to be calibrated is placed onto the first contact area and a plurality or all of the further contact-connecting needles of the needle card at tester channels that are not to be calibrated are placed onto the second contact area.

17 Claims, 3 Drawing Sheets

CALIBRATION DEVICE FOR THE CALIBRATION OF A TESTER CHANNEL OF A TESTER DEVICE AND A TEST SYSTEM

CROSS-REFERENCE TO RELATED APPLICATIONS

This application claims foreign priority benefits under 35 U.S.C. §119 to co-pending German patent application number DE 103 33 101.8-35, filed Jul. 21, 2003. This related patent application is herein incorporated by reference in its entirety.

BACKGROUND OF THE INVENTION

1. Field of the Invention

The invention relates to a calibration device for the calibration of a tester channel of a tester device and to a tester system with such a calibration device.

2. Description of the Related Art

Semiconductor components are typically tested with the aid of test systems after their production. For this purpose, the semiconductor components, in the unsawn state, are contact-connected with the aid of a needle card having contact-connecting needles. The contact-connecting needles are connected via tester channels to a tester device which sends test signals to the connected integrated circuits and receives response signals from the integrated circuits via the tester channels. Usually, tester signals and response signals are transmitted via a tester channel, i.e., a single line between each integrated circuit and the tester device.

During testing, the temporal reference (timing) and the strength of signals are also taken into account besides the functionality. Since the tester channels essentially do not have the same electrical behavior with regard to the signal delay and the signal attenuation, it is necessary to calibrate the tester device. Each of the tester channels is provided with a delay element and an amplifying element in the tester device, in order that the test signals driven onto the tester channel are delayed in accordance with a variable time duration or, if appropriate, are accelerated, given an already preset delay, or amplified in accordance with a predetermined value. This makes it possible to ensure that the test signals are present at the integrated circuit with the same phase angle, i.e., with the same temporal reference with respect to a reference and with essentially the same signal strength. To set each delay unit and each amplifier unit of the tester channels, it is necessary to calibrate each tester channel.

The calibration of a tester channel is usually carried out by applying a calibration signal to a non-contact-connecting tester channel and measuring the temporal profile of the signal and the amplitude voltage of the resulting reflected calibration signal.

To achieve higher accuracies, a point-to-point calibration is used, particularly in test technology, at the component level. A calibration robot is usually used to adjust the properties of the tester channels. The calibration robot goes over the contact-connecting needles of the needle card individually and connects them to the measurement lines of the test. The tester channels are then individually adjusted with regard to the signal gain and the signal propagation time.

The technology of the dual transmission line is now increasingly being used in wafer test methods as well, with the result that the calibration robot can no longer be used. The substrate wafer on which the integrated circuits are situated is contact-connected to a needle card, which establish the contact between the integrated circuit and the tester device. The needle cards are usually mounted fixedly in the tester device and difficult to access externally, so that the calibration robot has no access to the needle card.

Therefore, in point-to-point calibration systems for dual transmission line systems, an additional electromechanically positionable calibration pad is provided in the tester device, which can be taken to the contact-connecting needle of the tester channel to be calibrated. The calibration pad contact-connects the contact-connecting needle of the needle card. This calibration device is complicated because a precise electromechanical positioning system is necessary. Moreover, the positionable calibration pad leaves adjacent contact-connecting needles at undefined potentials which can influence the calibration operation.

SUMMARY OF THE INVENTION

It is an object of the present invention to provide a calibration device for use in a tester device with which a tester device, in particular a tester device for a wafer test method with a point-to-point calibration, can be calibrated more simply and more precisely.

A first aspect of the present invention provides a calibration device for calibrating a tester channel of a tester device. The tester device serves for contact-connecting integrated components on a substrate wafer to test the components with electrical signals. The calibration device has a connecting device and a planar contact carrier, on which a first contact area and a second contact area insulated from the first contact area are arranged. The first and second contact areas can be electrically connected via the connecting device. The connecting device is suitable for connecting the first and second contact areas to the tester device. The first contact area is generally surrounded by the second contact area, so that when a needle card connected to the tester device is placed on the contact carrier of the calibration device, one of the contact-connecting needles of the needle card which is connected to the tester channel to be calibrated is placed onto the first contact area and a plurality or all of the further contact-connecting needles of the needle card at tester channels that are not to be calibrated are placed onto the second contact area.

The calibration device may be inserted into a conventional tester device for testing integrated circuits in a wafer test method to carry out the calibration of the tester channels of the tester device.

All the tester channels may be calibrated in this way, so that during the testing of the integrated circuits, the signals are present with a defined signal strength and with a common time reference at the integrated circuits. To reduce the influence of adjacent lines of other tester channels, the lines of the remaining tester channels are contact-connected to the second contact area, which are likewise connected to the tester device via the connecting device.

The calibration device may be positioned appropriately during the calibration of each tester channel for the contact-connection of the corresponding contact-connecting needle. For this purpose, the calibration device may utilize a conventional so-called wafer sampler which is used in production and is also used for contact-connecting integrated chips on the silicon wafer. An already existing system may be utilized for positioning and adjustment in all three dimensions. Instead of the "product wafer," only the "calibration device" is loaded onto the carrier and the so-called "chuck" and then correspondingly contact-connected to the needle card.

The second contact area may be connected to a fixed potential, e.g., a ground potential, to minimize the influence of the adjacent tester channels. In the same way as the connection between the connecting device and the tester device, the calibration device has a defined electrical behavior with regard to the signal attenuation and the signal propagation time. In accordance with the measured total signal attenuation and the measured total signal propagation time between a transmitting device in the tester device via the line of the tester channel, the calibration device, the connecting device and back to a receiving device of the tester device, a delay unit for the tester channel to be calibrated and an amplifying unit can be adapted correspondingly, so that, during testing, the test signal is present at the first contact area with a defined temporal reference, e.g., with respect to a reference signal, with a defined signal strength.

The connecting device may be formed as a coaxial connection with an inner connection and an outer connection surrounding the inner connection. The inner connection is connected to the first contact area, and the outer connection is connected to the second contact area.

The contact carrier may have an insulation layer on which the first and second contact areas are arranged on one side. A conductive shielding layer may be provided on that side of the insulation layer which is opposite to the contact areas. This constitutes a contact carrier construction which is simple and as planar as possible, so that the calibration device can be introduced into the tester device in the same way as a substrate wafer with integrated circuits to be tested. The provision of the conductive shielding layer enables the tester device to be calibrated in particular with high-frequency test signals, since the calibration signal is passed in shielded fashion in the calibration device as well.

As an alternative, the contact carrier may have a first insulation layer and a second insulation layer, between which a conductive layer for connecting the first contact area to the connecting device is disposed. The first and second contact areas are arranged on a surface of the first insulation layer which is opposite to the conductive layer. A conductive shielding layer is provided on a surface of the second insulation layer which is opposite to the conductive layer. The shielding layer may be connected to the connecting device and in contact with the second contact area. In this way, the connecting device may be connected in shielded fashion to the first contact area (i.e., from the point of contact with the contact-connecting needle of the tester device to the connecting device). For this purpose, the conductive shielding layer is connected to the second contact area.

A third contact layer may be provided which is arranged in a manner insulated from the first and second contact areas on the surface of the contact carrier. The third contact area may be arranged adjacent to the first contact area such that a tester channel adjacent to the tester channel to be calibrated is connected to the third contact area when the needle card is placed onto the contact carrier, i.e., a further line to which a signal is applied is led in the vicinity of the tester channel to be calibrated. In this way, the calibration of a tester channel may be carried out while a specific signal pattern or some other, possibly changing, signal is applied to the third contact area. Since adjacent tester channels can influence one another as a result of crosstalk or other effects, coupling effects between adjacent tester channels can thus be taken into account during the setting of the gain and the delay.

Different signal attenuations and propagation times influenced by the adjacent tester channel can thus be compensated for, even in the course of the test method, depending on the signals of the adjacent tester channels, by means of correspondingly variable signal gains and signal delays.

The connecting device may be arranged laterally with respect to the contact carrier, and the connecting device may be connected to the first contact area via the conductor track applied on the contact carrier.

A further aspect of the present invention provides a tester system with a tester device and with a calibration device. The tester device has a plurality of tester channels, and a first and a second transmission line for signal transmissions in opposite signal directions may be provided per tester channel. The first and second transmission lines of the tester channel to be calibrated can be connected to the first contact area via the contact-connecting needle of the needle card. A calibration line connects the tester device to the connecting device.

With this tester system having the inserted calibration device, the tester channels of the tester system may be calibrated individually. In this case, to calibrate the forward lines of the tester channel, a calibration signal is applied to the forward line of the tester channel, and the signal is thus applied to the first contact area of the calibration device via the needle card and the contact-connecting needle arranged thereon. The calibration signal sent via the forward line of the tester channel is fed back to the tester device via the connecting device of the calibration device and via the calibration line. At the tester device, the propagation time and the signal attenuation are measured, which are utilized to determine a signal delay and signal gain for sending signals onto this tester channel. In the same way, a further calibration signal can be applied via the calibration line from the tester device to the connecting device of the calibration device and can be received by the tester device via the first contact area, the contact-connecting needle of the needle card and the return line of the tester channel.

A further aspect of the present invention provides a method for calibrating a tester channel of a tester system with a calibration device. The tester channel is calibrated by setting a determined signal delay and a determined signal gain for a test signal transmitted via the tester channel. The first contact area is electrically connected to the tester channel, and the calibration device is connected to the tester device via the connecting device. The signal attenuation and signal propagation time of a calibration signal from the tester device via the tester channel, through the calibration device and via the connecting device back to the connected tester device, are measured. The signal delay may be set in accordance with the signal propagation time, and the signal gain may be set in accordance with the signal attenuation.

The method according to one embodiment of the invention makes it possible to determine the signal attenuation and signal propagation time of the tester channel between the tester device and the first contact area, assuming that the signal propagation times and signal attenuations of the calibration device, of the connecting device and of the connection between the connecting device and the tester device are known. The signal gain and the signal delay for each tester channel may be individually set by performing a calibration according to embodiments of the invention, so that the contact-connecting needle at each tester channel may provide a contact-connection at a contact area such that the test signal with a defined signal strength and a defined temporal reference may be applied to an integrated circuit to be tested.

BRIEF DESCRIPTION OF THE DRAWINGS

Preferred embodiments of the invention are explained in more detail below with reference to the accompanying drawings, in which.

DETAILED DESCRIPTION OF THE PREFERRED EMBODIMENT

Figure 1:
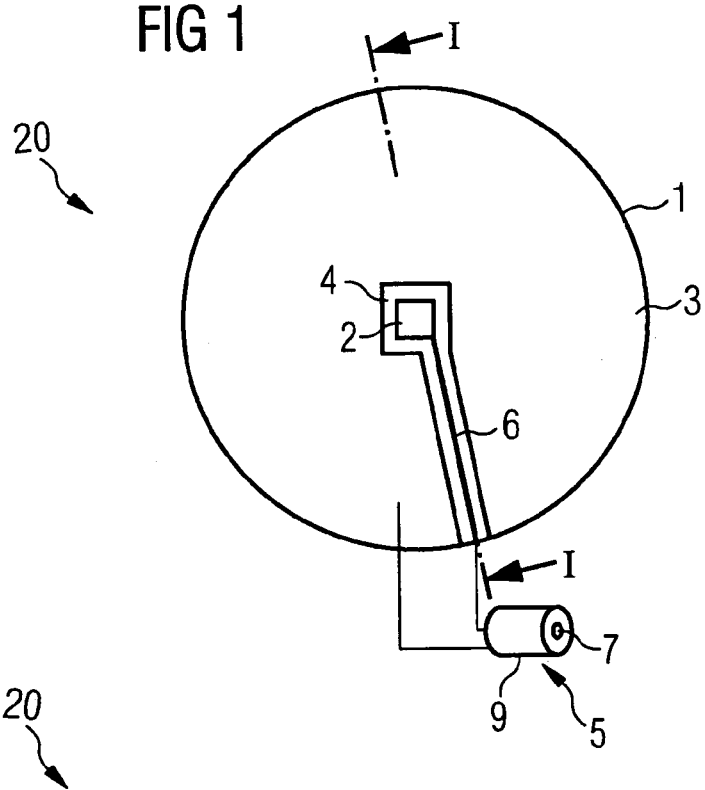
FIG. 1 shows a plan view of a calibration device in accordance with a first embodiment of the invention.

FIG. 1 illustrates a first calibration device 20 in accordance with a first embodiment of the invention. The first calibration device 20 has a conductive or nonconductive substrate 1, on which is applied a first contact area 2 in an insulated manner in a second contact area 3 surrounding the first contact area 2. The contact areas 2, 3 may be formed from a metallic material having a low resistance coefficient. An insulation layer 10 applied on the substrate 1 is arranged between the contact areas and the substrate 1, so that a region between the first contact area and the second contact area which is not formed as a contact area forms an insulation between the first contact area 2 and the second contact area 3.

The first calibration device 20 has a connecting device 5, which may be embodied in the form of a coaxial plug connector disposed laterally with respect to the substrate 1. The first contact area 2 is connected to the inner conductor 7 of the coaxial plug connector via a conductor track 6 routed on the surface of the first calibration device. The outer conductor 9 of the connecting device 5 (also referred to herein as coaxial plug connector) is connected to the second contact area 3.

As an alternative, the connecting device 5 may also have contact pins to be connected to the carrier on which the first calibration device bears. Connecting devices 5 configured in a different way may also be provided.

Figure 2:
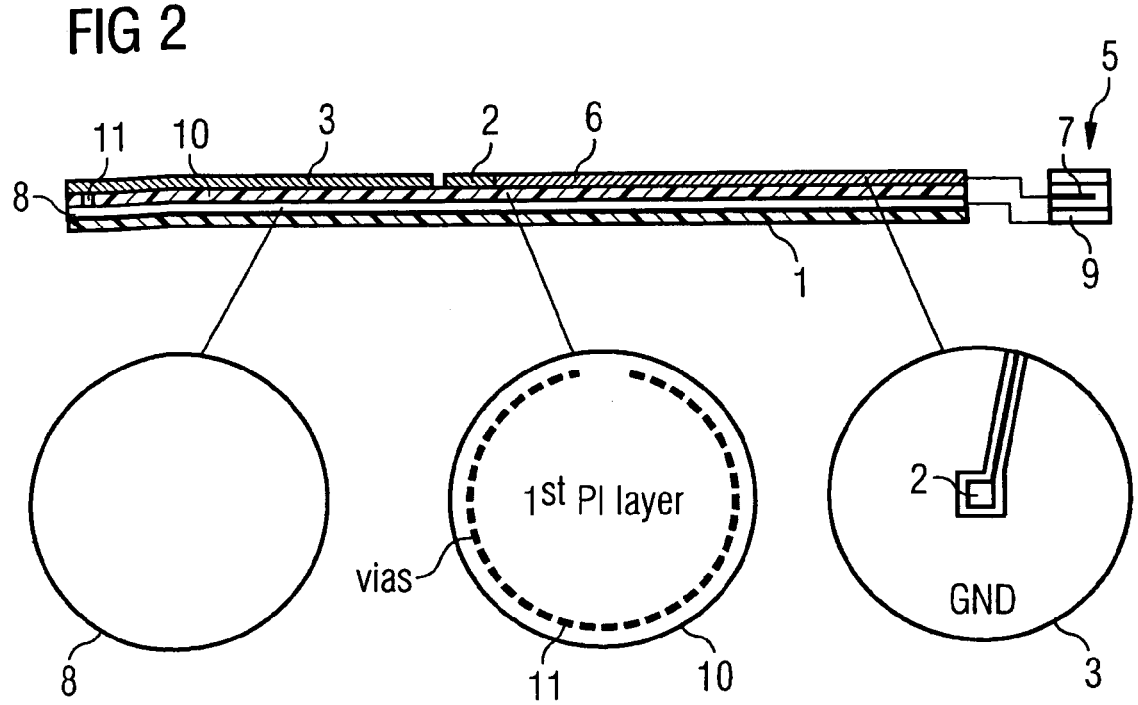
FIG. 2 shows a cross section through the calibration device of the embodiment according to FIG. 1 and also shows illustrations of individual layers of the calibration device.

FIG. 2 illustrates a cross section through the first calibration device 20 of the embodiment of FIG. 1. The calibration device has a plurality of layers arranged on the substrate 1. A conductive shielding layer 8 is applied on the substrate 1 and is connected to the outer connection 9 of the coaxial plug connector 5. Situated on the shielding layer 8 is an insulation layer 10 having passage openings 11 in order to establish an electrical connect between the shielding layer and the second contact area 3 applied on the insulation layer. A plurality of passage openings 11 may be provided to ensure a uniform potential distribution on the second contact area 3 and to provide a contact with the lowest possible resistance between each position of the second contact area 3 and the outer connection 9 of the coaxial plug connecting device 5. The first contact area 2 and the connecting line between the contact area 2 and the inner connection 7 of the coaxial plug connector are likewise applied on the insulation layer 10.

Figure 3:
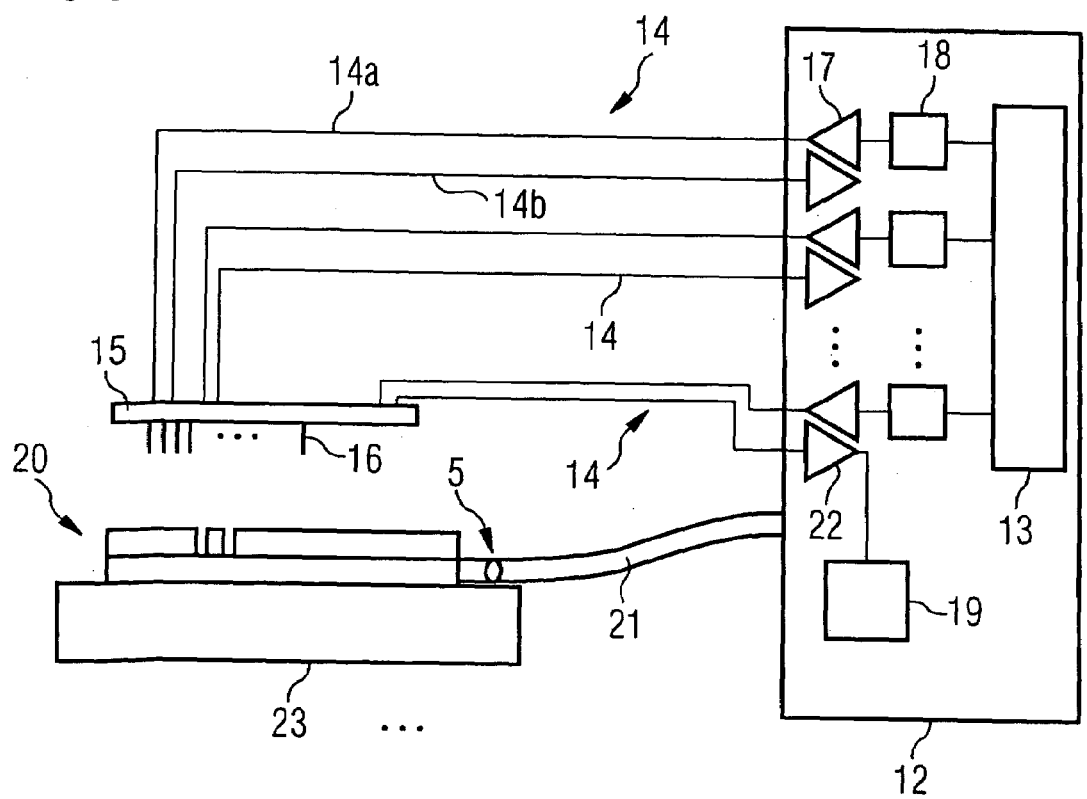
FIG. 3 shows a schematic diagram of a test system having a calibration device according to one embodiment of the invention.

The first calibration device 20, according to one embodiment of the invention, serves to calibrate tester channels of a tester device. A tester device is illustrated in FIG. 3. The tester device 12 comprises a test pattern generator 13, which provides test signals for testing integrated circuits. The test signals are transmitted to a needle card 15 via tester channels 14. The needle card 15 has contact-connecting needles 16 which can be placed onto contact areas of the integrated circuits to be tested to contact-connect the integrated circuits.

The tester channels 14 are embodied as point-to-point connections and in each case have a forward line 14A and a return line 14B. The signal is transmitted from the tester device 12 to the needle card 15 on the forward line 14A and a signal received by the needle card 15 is transmitted to the tester device 12 via the return line 14B. Since each of the forward and return lines 14A, 14B of the tester channels 14 has a different signal attenuation and a different signal propagation time on account of its length and/or configuration, compensating elements are provided in the tester device 12.

The compensating elements for the forward lines 14A alter the test signals provided by the test pattern generator in such a way that, at the contact-connecting needles 16, the test signals are present with substantially the same signal strength and substantially the same temporal reference with respect to one another or with respect to a reference clock signal. For this purpose, signal amplifiers 17 and delay elements 18 are provided for each of the forward lines 14A in the tester device 12. Each of the return lines 14B of the tester channels 14 is connected to a test evaluation unit 19 via a further signal amplifier 22 to analyze the received signals output by the integrated circuit to be tested.

To calibrate the signal amplifiers 17 and the delay units 18 of each tester channel, a calibration unit 20 is provided on a carrier 23 in such a way that the calibration unit 20 can be contact-connected by the needle card 15. To determine the individual signal gains and signal delays which are to be set on the signal amplifiers 17 and the delay elements 18, each of the contact-connecting needles 16 of the needle card 15 is successively placed onto the calibration device in such a way that the contact-connecting needle 16 that is connected to a test channel 14 contact-connects the first contact area 2, while the remaining or a plurality of the remaining contact-connecting needles of the needle card 15 contact-connect the second contact area 3. It is thus ensured that the tester channels 14, i.e., the forward lines 14A and return lines 14B of the tester channels 14, which are connected to the second contact area 3 are at a fixed potential.

The fixed potential is prescribed for the second contact area 3 by the tester device via the connecting device 5. Via the connecting device 5, the calibration device 20 is connected to the tester device 12 via a feedback line 21. The signal attenuation and signal delay of the calibration device and of the feedback device 21 are essentially known precisely.

For calibration, a calibration signal is made available by the tester device 12. The calibration signal is transmitted via the forward line 14A of one of the tester channels 14, via the needle card 15, via the contact-connecting needle 16 assigned to the tester channel 14, via the first contact area 2 of the calibration device 20 and via the feedback line 21. The signal delay of the calibration signal and the attenuation thereof are measured. Since the signal attenuations and signal delays in the calibration device 20 and the feedback line 21 are known beforehand, the signal attenuation between the tester device 12 and the contact-connecting needle of the relevant tester channel 14 and also the temporal delay thereof can be determined from the measured signal delay and the measured signal attenuation. These then serve as a basis for setting the relevant signal amplifier 17 and the delay element 18.

As an alternative, the respective signal attenuations and signal delays may also be compared with corresponding reference values, the signal amplifier 17 and the delay element 18 being adapted while the calibration signal is present until the signal present at the contact-connecting needle has the desired signal strength and the desired temporal reference.

Figure 4:
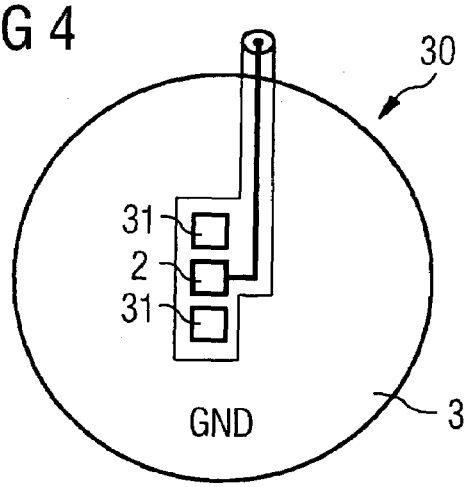
FIG. 4 shows a plan view of a calibration device in accordance with a second embodiment of the invention.

FIG. 4 illustrates a second calibration device 30 in accordance with a second embodiment of the present invention. The second calibration device 30 differs from the first calibration device 20 in accordance with the first embodiment in that two further third contact areas 31 are provided adjacent to the first contact area 2. The third contact areas may be arranged in an insulating manner on the surface of the substrate. The number of third contact areas 31 may be provided as desired. No connection is provided between the third contact areas 31 and a corresponding connecting device of the second contact-connecting device 30. Upon placement of the needle card 15 of the tester device 12, a forward line 14A of one of the tester channels 14 is connected to the first contact area 2. Forward and return lines 14A, 14B of the tester channels 14 that are adjacent thereto are connected to the third contact areas 31, so that the tester channels connected to the third contact areas 31 are electrically insulated from the remaining tester channels 14. All of the remaining or a plurality of the remaining tester channels 14 are then connected to the second contact area 3 of the further calibration device 30 via the needle card 15.

The further calibration device 30 makes it possible to perform the calibration of a tester channel 14 in accordance with the method described above and also to carry out the calibration in a manner dependent on predetermined signal profiles on tester channels adjacent to the tester channel to be calibrated. Thus, by way of example, the potential of one or a plurality of the adjacent tester channels 14 may be altered in accordance with a predetermined pattern to determine the influence thereof on the tester channel 14 to be calibrated. The signal amplifier 17 and delay element 18 assigned to the tester channel 14 to be calibrated may then be assigned a signal gain and a signal delay which result from an average value of the measured signal propagation times and signal attenuations on the tester channel 14 to be calibrated. During the testing of integrated circuits with the aid of the tester device 12, the respective signal gain and the respective signal delay may be adapted to the state or the states or the signal profile of the adjacent tester channels 14.

Figure 5:
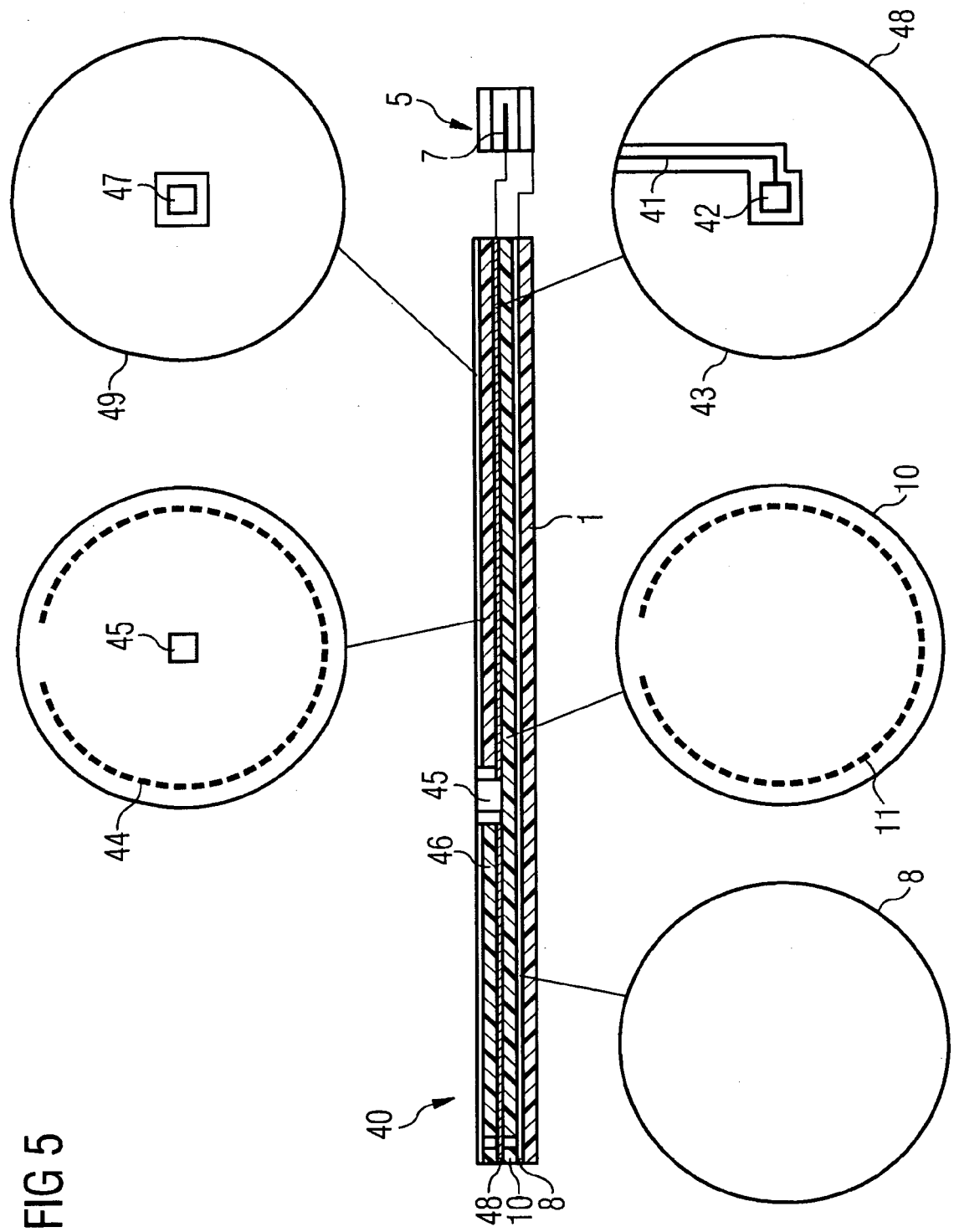
FIG. 5 shows a cross section through a calibration device in accordance with a third embodiment, the calibration device having a plurality of layers which are each illustrated in a plan view.

FIG. 5 illustrates a cross section through a third embodiment for a third calibration device 40 according to the invention. In the same way as in the previous embodiments, a conductive shielding layer 8 is applied on the substrate 1, and an insulation layer 10 may be arranged on the shielding layer 8. The insulation layer 10 has the passage openings 11 to provide an electrical connection between the shielding layer 8 and a contact-connecting layer 48 applied on the insulation layer 10. The contact-connecting layer 48 has a conductor track 41 to connect a contact region 42 to the inner conductor 7 of the coaxial connecting device 5.

The connecting conductor 41 is routed in an insulated manner and surrounded by a ground layer 43. The ground layer 43 is in contact with the shielding layer 8 via the passage openings 11. A further insulation layer 46 is applied on the contact-connecting layer 48. The further insulation layer 46 has further passage openings 44 and a contact opening 45 to enable a passage contact-connection. A further first and second contact area 47, 49 are then applied on the further insulation layer 46.

The first further contact area 47 is electrically conductively connected through the contact opening 45 to the contact region 42 of the contact-connecting layer 48. The second further contact area 49 is electrically conductively connected to the ground region 43 and the shielding layer 8 via the further passage openings 44. The shielding layer 8 is connected to the outer connection of the coaxial plug connector 5.

In this way, the connection between the first contact area 47 and the coaxial plug connector 5 does not have to be routed via the surface of the third calibration device 40, but rather can be routed within the third calibration device 40. Thus, all the tester channels surrounding the test channel to be calibrated may be connected to the second contact area, which may be brought to a defined potential in this way to enable a calibration under defined ambient conditions.

What is claimed is:

1. A calibration device for calibrating a tester channel of a tester device, comprising:
    a contact carrier comprising a first contact area and a second contact area insulated from the first contact area, wherein the first contact area is connectable to the tester channel being calibrated and the second contact area is connectable to one or more remaining tester channels of the tester device; and
    a connecting device for electrically connecting the first and second contact areas through a calibration line to the tester device;
    wherein the first contact area is contact-connectable to one of a plurality of contact-connecting needles of a needle card connected to the tester channel to be calibrated and the second contact area is contact-connectable to one or more remaining contact-connecting needles of the needle card which are connected to the one or more remaining tester channels; and
    wherein the contact carrier further comprises a planar substrate having a first conductive shielding layer disposed thereon and a first insulation layer disposed on the first conductive shielding layer, wherein the first and second contact areas are disposed on the insulation layer.

2. The calibration device of claim 1, wherein the second contact area is electrically connected to the first conductive shielding layer through a plurality of passages through the first insulation layer.

3. The calibration device of claim 1, wherein the first contact area is surrounded by the second contact area.

4. The calibration device of claim 3, wherein the contact carrier further comprises:
    a connection layer disposed on the first insulation layer, the connection layer comprising a first contact-connection area, a second contact-connection area and a conductor track connecting the first contact-connection area to the connecting device; and
    a second insulation layer disposed on the connection layer, wherein the first and second contact areas are disposed on the second insulation layer, wherein the first contact-connection area and the second contact-connection area are respectively connected to the first and second contact areas through a plurality of passages in the second insulation layer.

5. The calibration device of claim 1, further comprising a third contact area which is insulated from the first and second contact areas, disposed on the contact carrier adjacent to the first contact area such that an adjacent tester channel to the tester channel to be calibrated is connected to the third contact area when the needle card is placed onto the contact carrier.

6. The calibration device of claim 1, wherein the connecting device comprises a coaxial connection having an inner connection and an outer connection surrounding the inner connection, the inner connection and the outer connection each respectively connected to one of the first contact area and the second contact area.

7. The calibration device of claim 6, wherein the connecting device is disposed laterally with respect to the contact carrier and is connected to the first contact area via a conductor track on the contact carrier.

8. A tester system, comprising:
a tester device having a plurality of tester channels, wherein each tester channel comprises a first transmission line and a second transmission line for signal transmissions in opposite directions;
a needle card for contact-connecting to integrated circuits on a wafer, the needle card having a plurality of contact-connecting needles respectively connected to the plurality of tester channels; and
a calibration device, comprising:
a contact carrier comprising a first contact area and a second contact area insulated from the first contact area, wherein the first contact area is connectable to the contact-connecting needle of the needle card connected to the first and second transmission lines of the tester channel being calibrated and wherein the second contact area is connectable to one or more remaining contact-connecting needles of the needle card which are connected to the one or more remaining tester channels; and
a connecting device for electrically connecting the first and second contact areas through a calibration line to the tester device;
wherein the contact carrier further comprises a planar substrate having a first conductive shielding layer disposed thereon and a first insulation layer disposed on the first conductive shielding layer, wherein the first and second contact areas are disposed on the insulation layer.

9. The tester system of claim 8, wherein the second contact areas are electrically connected to the first conductive shielding layer through a plurality of passages through the first insulation layer.

10. The tester system of claim 8, wherein the first contact area is surrounded by the second contact area.

11. The tester system of claim 10, wherein the contact carrier further comprises:
a connection layer disposed on the first insulation layer, the connection layer comprising a first contact-connection area, a second contact-connection area and a conductor track connecting the first contact-connection area to the connecting device; and
a second insulation layer disposed on the connection layer, wherein the first and second contact areas are disposed on the second insulation layer, wherein the first contact-connection area and the second contact-connection area are respectively connected to the first and second contact areas through a plurality of passages in the second insulation layer.

12. The tester system of claim 8, further comprising a third contact area which is insulated from the first and second contact areas, disposed on the contact carrier adjacent to the first contact area such that an adjacent tester channel to the tester channel to be calibrated is connected to the third contact area when the needle card is placed onto the contact carrier.

13. The tester system of claim 8, wherein the tester device further comprises a test pattern generator, a test evaluation unit, and a plurality of signal amplifiers and delay elements correspondingly provided for the plurality of tester channels.

14. The tester system of claim 8, further comprising:
a carrier for selectively placing the calibration device in contact with needle card in the tester system.

15. A method for calibrating a tester channel of a tester system, comprising:
connecting a calibration device to a needle card of the tester system, wherein the calibration device comprises a contact carrier comprising a first contact area and a second contact area insulated from the first contact area and a connecting device electrically connecting the first and second contact areas through a calibration line to a tester device of the tester system and wherein the first contact area is connected to a contact-connecting needle of the needle card connected to a forward transmission line and a return transmission line of the tester channel being calibrated and wherein the second contact area is connected to one or more remaining contact-connecting needles of the needle card which are connected to the one or more remaining tester channels;
transmitting a test signal through the forward transmission line of the tester channel connected to the first contact area;
receiving the test signal through the calibration line by the tester device;
measuring a test signal propagation time and a test signal attenuation of the received test signal; and
determining and setting a signal delay of the tester channel in accordance with the test signal propagation time and a signal gain of the tester channel in accordance with the test signal attenuation.

16. The method of claim 15, wherein a fixed potential is applied to the second contact area.

17. The method of claim 15, further comprising:
connecting one or more adjacent tester channels to one or more third contact areas on the contact carrier which are insulated from the first and second contact areas; and
providing another signal through the adjacent tester channels during calibration of the tester channel.

* * * * *